United States Patent [19]

Morokawa et al.

[11] 3,938,316

[45] Feb. 17, 1976

[54] TEMPERATURE COMPENSATED ELECTRONIC TIMEPIECE

[75] Inventors: Shigeru Morokawa, Tokorozawa; Yukio Hashimoto, Niiza; Yasuhiko Nishikubo, Iruma, all of Japan

[73] Assignee: Citizen Watch Co., Ltd., Tokyo, Japan

[22] Filed: Feb. 6, 1974

[21] Appl. No.: 440,240

[30] Foreign Application Priority Data

Feb. 10, 1973  Japan.............................. 48-16720
July 13, 1973  Japan.............................. 48-79084
July 25, 1973  Japan.............................. 48-83848
Nov. 23, 1973  Japan............................. 48-132380

[52] U.S. Cl................................ 58/23 R; 58/23 A
[51] Int. Cl.²......................................... G04C 3/00
[58] Field of Search.... 58/23 R, 23 A, 23 AC, 85.5; 331/176, 116 M; 310/8, 1, 8.9

[56] References Cited
UNITED STATES PATENTS

| | | | |
|---|---|---|---|
| 2,811,647 | 10/1957 | Nilssen................................ 331/176 |
| 3,388,344 | 6/1968 | West................................ 331/176 X |
| 3,526,853 | 9/1970 | Vittoz............................. 331/176 X |
| 3,531,739 | 9/1970 | Groves........................... 331/176 X |
| 3,690,546 | 9/1972 | Uehara................................ 331/176 |
| 3,713,033 | 1/1973 | Frerking........................ 331/176 X |
| 3,719,838 | 3/1973 | Peduto et al.................... 331/176 X |
| 3,800,523 | 4/1974 | Yamazaki........................... 58/23 R |

*Primary Examiner*—L. T. Hix
*Assistant Examiner*—U. Weldon
*Attorney, Agent, or Firm*—Ernest G. Montague; Karl F. Ross; Herbert Dubno

[57] ABSTRACT

A temperature compensated electronic timepiece comprises a time reference signal generator for generating a time reference signal and a temperature compensating device for compensating a change of the oscillating frequency of the time reference signal generator caused by any external temperature change. The temperature compensating device comprises a temperature detector having an element composed of two semiconductors of different respective conductivities (such as a transistor composed of P and N type semiconductors) which are joined to form a junction, or an element composed of a conductor and a semiconductor joined to form a junction. The voltage-current characteristics of the junction are changed when the external temperature exceeds a given temperature to deliver a digital signal whose state is reversed from an initial condition. The output signal from the temperature detector compensates any temperature change of the oscillating frequency of the time reference signal generator.

2 Claims, 17 Drawing Figures

TEMPERATURE COMPENSATED ELECTRONIC TIMEPIECE

This invention relates to a temperature compensated electronic timepiece comprising a time reference signal generator, where any change of its oscillating frequency caused by the exterior temperature change is compensated.

Figures 1, 2:
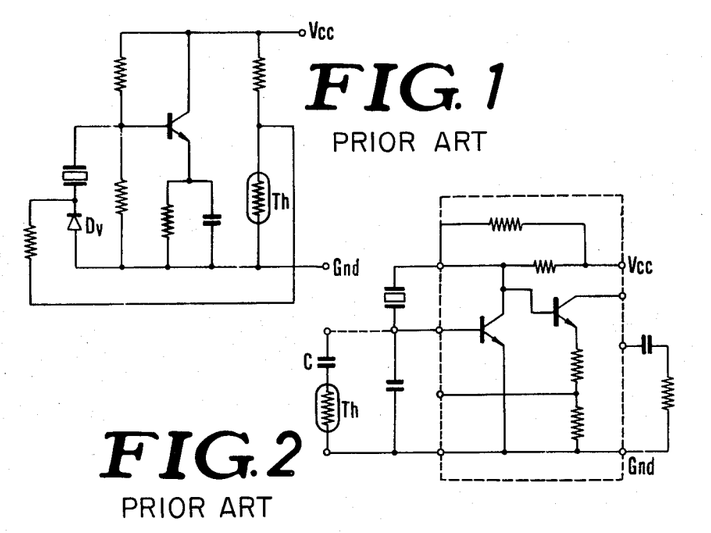
FIGS. 1 and 2 are oscillator circuit diagrams comprising temperature compensating devices which make use of conventional temperature sensitive resistor elements, respectively.

Heretofore, the temperature compensation of the electronic timepiece has been effected in an analog manner with the aid of a temperature sensitive element. For example, it has been proposed to effect the temperature compensation of an oscillator circuit by means of a combination of a temperature sensitive resistor element Th and a variable diode Dv as shown in FIG. 1, or to effect the temperature compensation of an oscillator circuit including a crystal oscillator and incorporated into an integrated circuit as shown by dash lines in FIG. 2 by means of a combination of the temperature sensitive resistor element Th and a capacity C.

The above-described temperature compensating device has the disadvantage that the temperature sensitive resistor element Th becomes longer after a lapse of time to render the operation of the circuit unstable, i.e. it is difficult to incorporated the circuit elements into an integrated circuit, and the compensating characteristic of the temperature sensitive resistor element Th must be matched with the temperature characteristic of the reference oscillator.

An object of the present invention is to provide a temperature compensated electronic timepiece which can effect a stable temperature compensatiion for a long time.

Another object of the present invention is to provide a temperature compensated electronic timepiece comprising a temperature compensating device substantially all of the circuit elements of which can be incorporated into an integrated circuit.

The invention will now be described in greater detail with reference to the accompanying drawings, wherein.

Figures 3, 4:
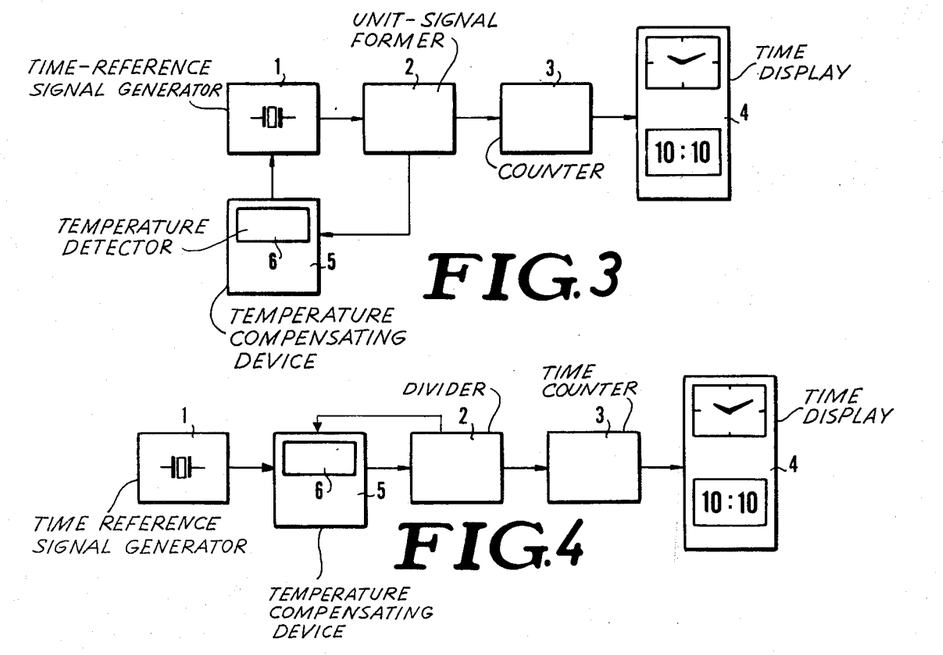
FIGS. 3 and 4 are block diagrams showing different embodiments of the electronic timepiece according to the invention.

In FIG. 3 is shown one embodiment of the temperature compensated electronic timepiece according to the invention. Reference numeral 1 designates a time reference signal generator for generating a time reference signal; it may, for example, be a crystal oscillator; 2 is a divider for frequency dividing the time reference signal and forming timing necessary for the timepiece, 3 is a time counter for counting the time pulses and forming a time indication signal, 4 is a time display driven by the output delivered from time counter 3 and indicating the time, and 5 is a temperature compensating device provided with a temperature detector 6 and delivering a digital signal whose state is reversed from an initial condition when the temperature exceeds a given temperature.

A temperature compensating signal is formed on the basis of a signal delivered from the temperature detector and applied to the time reference signal generator 1 so as to compensate the change in frequency caused by the temperature change of the output delivered from the time reference signal generator 1. Thus, substantially the same output frequency is delivered from time reference signal generator 1 even when its temperature is changed.

In FIG. 4 there is shown another embodiment of the temperature compensated electronic timepiece according to the invention. In that embodiment, if the temperature is changed, the output frequency of the time reference signal generator 1 is changed also. This change of output frequency is compensated by the temperature compensating device 5.

The temperature detector 6 provided for the temperature compensating device 5 will now be described in greater detail.

Figure 5:
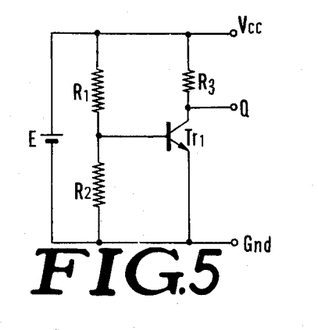
FIG. 5 is a basic circuit diagram showing a temperature detector of the temperature compensating device adapted for use in the electronic timepiece according to the invention.

FIG. 5 illustrates a basic circuit diagram of the temperature detector shown in FIGS. 3 and 4. $Tr_1$ designates a transistor used as a temperature detecting element and composed of semiconductors having different conductivities. The electrical characteristics of temperature change subjected to the pn junction of transistor $Tr_1$ subjected to a temperature change are given by:

$$I = Is\,(e^{qv/kt} - 1) = Is \cdot e^{qv/kt}$$

where $q$ is the electric charge of an electron, $t$ is an absolute temperature, $k$ is Boltzmann's constant, $v$ is the voltage across the pn junction, and $Is$ is the saturation current flowing through the pn junction in an opposite to normal direction. In FIG. 5, $R_1$ and $R_2$ are base bias resistors, and $R_3$ is a collector resistor.

In the above-described construction of the temperature detector shown in FIG. 5, the transistor $Tr_1$ is used to reverse a two valued logic signal where its base-emitter voltage Vbe is changed in dependence on a temperature change. Thus, if a voltage dividing ratio between the base bias resistors $R_1$ and $R_2$ is predetermined for the base-emitter voltage Vbe at a given temperature to equal the threshold value of the transistor $Tr_1$ the transistor $Tr_1$ will be in an OFF condition when the temperature does not exceed that given temperature, its collector potential being equal to "1". In the two valued logic, a high level is a "1" while a low level is a "0". When the temperature exceeds that given temperature, the transistor will be in an ON condition to make the collector potential equal to 0. A collector potential of 0 of the two valued logic therefore signals a temperature change as described above.

If the current amplification of the transistor $Tr_1$ and the collector resistor $R_3$ are both large and the base bias resistors $R_1$ and $R_2$ are both small the two valued logic signal may rise or decrease sharply. If very small base bias resistors $R_1$ and $R_2$ are selected, the current consumption also increases. In this case, a buffer amplifier may be used as a stage following transistor $Tr_1$ for the purpose of obtaining an effect equivalent to the one described above. In addition, in the event of a power supply voltage variation a constant voltage circuit may be provided in order to render the two valued logic signal itself stable irrespective of any temperature change.

Figure 6:
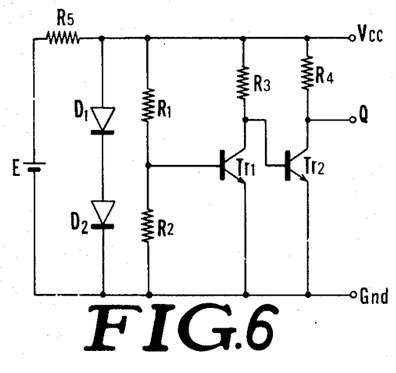
FIGS. 6 to 10 are circuit diagrams showing other embodiments of the temperature detector of the temperature compensating device adapted for use in the electronic timepiece according to the invention.

FIG. 6 illustrates a modification of the temperature detector circuit shown in FIG. 5. In that embodiment, provision is made for a constant voltage circuit composed of diodes $D_1$ and $D_2$ and a resistor $R_5$ connected in series with the power supply source E and for a buffer amplifier composed of a transistor $Tr_2$ and a collector resistor $R_4$ as a stage following transistor $Tr_1$ of that temperature detector shown in FIG. 5. In that embodiment, if the temperature is lower than a given temperature, the transistor $Tr_1$ is in an OFF condition, causing to make its collector potential to become 1, and as a result, the transistor $Tr_2$ changes to an ON condition reversing its output potential 0. If the temperature exceeds that given temperature, the transistor $Tr_1$ changes to an ON condition to make its collector potential 0, and as a result, the transistor $Tr_2$ is changed to an OFF condition to make its output potential 1. Thus, a logic signal of 1 signals a temperature change as described above.

Figure 7:
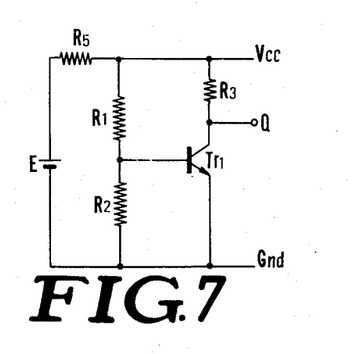

FIG. 7 shows another modified embodiment of the temperature detector circuit of FIG. 5. In that embodiment, a resistor $R_5$ is connected in series with the power supply source E. That embodiment constitutes not only a simple constant voltage circuit but also a temperature-voltage conversion circuit.

Figure 8:
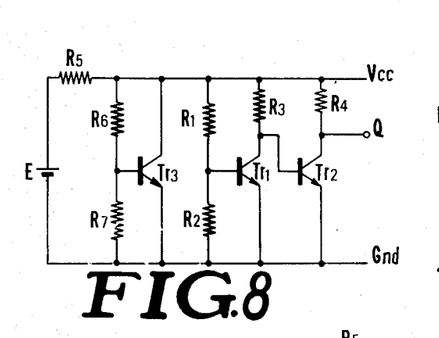

FIG. 8 shows a further modified embodiment of the temperature detector circuit of FIG. 5. In that embodiment, provision is made for a constant voltage circuit composed of a transistor $Tr_3$ and resistors $R_6$ and $R_7$.

Figure 9:
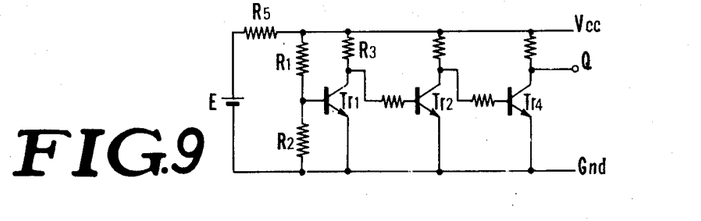

FIG. 9 shows a modification of the temperature detector circuit shown in FIG. 7. In that embodiment, a buffer amplifier composed of transistors $Tr_2$ and $Tr_4$ is added to the temperature detector circuit shown in FIG. 7.

In the above described embodiments, a transistor is used as the temperature detecting element. Such a transistor may, however, be replaced by a diode $D_3$ as shown in FIG. 10.

Figure 10:
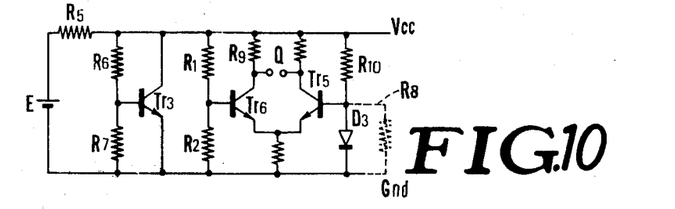

The temperature detector circuit shown in FIG. 10 makes use of a balanced type circuit in which the output from a differential amplifier is derived from a single input thereto. A diode $D_3$ more sensitive to temperature variations than a balanced type transistor is connected to the base of a transistor $Tr_5$ instead of a base voltage dividing resistor $R_8$. Thus, the diode $D_3$ serves as a temperature-voltage converter element. A voltage dividing ratio between a resistor $R_{10}$ and the diode $D_3$ is obtained so that the transistor $Tr_5$ is in an ON condition at a temperature higher than a given temperature and in an OFF condition at a temperature lower than that given temperature, and as a result, it is possible to obtain an output from the collector of the transistor $Tr_5$ at a temperature exceeding that given temperature. This output may be fed to a buffer amplifier having sharply increasing or decreasing output.

Various embodiments of the temperature detector 6 which can deliver a digital signal whose state is reversed from an initial condition at a temperature exceeding a given temperature has been described with reference to FIGS. 5 to 10.

Figure 11:
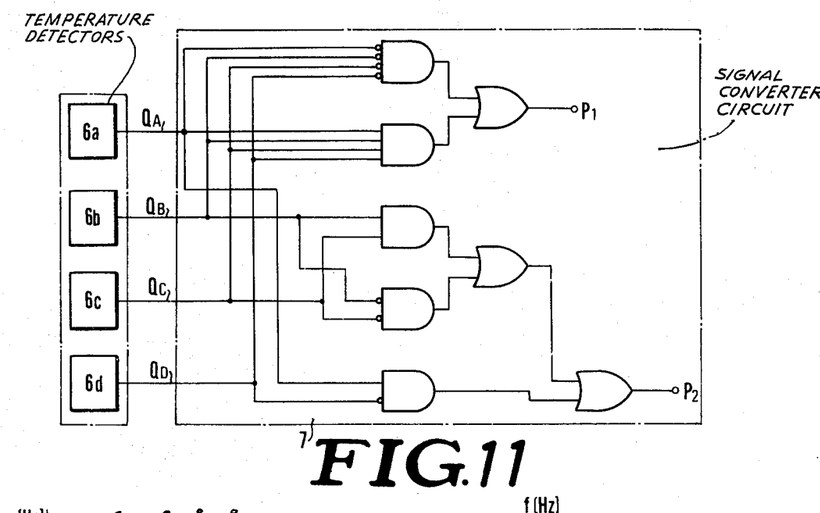
FIG. 11 is a circuit diagram showing a further embodiment of the temperature compensating device adapted for use in the electronic timepiece according to the invention and comprising a plurality of temperature detectors and a signal converter circuit for controlling the temperature-frequency characteristic to be corrected with the aid of the output signal from the temperature detectors.

Provision may be made for a plurality of temperature detectors 6a, 6b, 6c and 6d shown in FIGS. 5 to 10, respectively, which can deliver digital signals whose state is reversed from respective initial conditions at temperatures exceeding given temperatures, which respectively differ from each other as shown in FIG. 11. The digital signals from the temperature detectors 6a, 6b, 6c and 6d may be fed to a signal converter 7 from which digital coded signals may be derived.

In the temperature detectors 6a to 6d shown in FIG. 11, let the output of the two valued logic signal 1 be delivered from the output terminal $Q_A$ of the temperature detector 6a at a temperature higher than 10°C, delivered from the output terminal $Q_B$ of the temperature detector 6b at a temperature higher than 20°C, delivered from the output terminal $Q_C$ of the temperature detector 6c at a temperature higher than 30°C and delivered from the output terminal $Q_D$ of the temperature detector 6d at a temperature higher than 40°C, the relation between the temperatures and the output signals delivered from the output terminals $Q_A$ to $Q_D$ being shown in the table 1 below.

Table 1

|  | $Q_A$ | $Q_B$ | $Q_C$ | $Q_D$ |
|---|---|---|---|---|
| Not higher than 10°C | 0 | 0 | 0 | 0 |
| From 10°C to 20°C | 1 | 0 | 0 | 0 |
| From 20°C to 30°C | 1 | 1 | 0 | 0 |
| From 30°C to 40°C | 1 | 1 | 1 | 0 |
| Higher than 40°C | 1 | 1 | 1 | 1 |

In addition, the relation between the signals delivered from the output terminals $Q_A$ to $Q_D$ of the temperature detectors 6a to 6d and the signals delivered from the output terminals $P_1$ and $P_2$ of the signal converter circuit 7 is as shown in table 2 below.

Table 2

|  | $Q_A$ | $Q_B$ | $Q_C$ | $Q_D$ | $P_1$ | $P_2$ |
|---|---|---|---|---|---|---|
| Not higher than 10°C | 0 | 0 | 0 | 0 | 1 | 0 |
| From 10°C to 20°C | 1 | 0 | 0 | 0 | 0 | 1 |
| From 20°C to 30°C | 1 | 1 | 0 | 0 | 0 | 0 |
| From 30°C to 40°C | 1 | 1 | 1 | 0 | 0 | 1 |
| Higher than 40°C | 1 | 1 | 1 | 1 | 1 | 0 |

The use of the signals delivered from the output terminals $P_1$ and $P_2$ ensures a constant output frequency from the time reference signal generator 1 shown in FIG. 3 and from divider 2 shown in FIG. 4 irrespective of any temperature change.

The reason why the output frequency from the time reference signal generator 1 shown in FIG. 3 can be made substantially constant irrespective of any temperature change will now be described with reference to FIG. 12.

Figure 12:
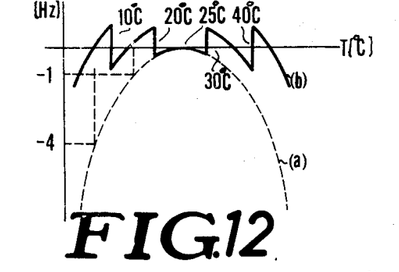
FIG. 12 graphically represents the temperature-frequency characteristics of the time reference signal generator.

In FIG. 12 there are graphically represented temperature-frequency characteristics of time reference signal generator 1 shown in FIG. 3.

Let the temperature-frequency of the time reference signal generator 1 shown in FIG. 3 be the dashed line (a) of FIG. 12. The use of the signals delivered from the output terminals $P_1$ and $P_2$ of the signal converter circuit 7 and having frequencies of 4Hz at a temperature not higher than 10°C, 1 Hz at a temperature from 10°C to 20°C, 0 Hz at a temperature from 20°C to 30°C, 1 Hz at a temperature from 30°C to 40°C and 4 Hz at a temperature higher than 40°C, respectively, makes it possible to compensate and change the temperature-frequency characteristic curve (a) into a temperature-frequency characteristic curve (b) shown by a full line in FIG. 12. The temperature-frequency characteristic curve (a) shown in FIG. 12 is therefore changed every 10°C. But, if the number of temperature detectors 6 is increased, the temperature-frequency characteristic (a) may be changed every 5°C, the precision of temperature compensation therefore increasing.

In the embodiments shown in FIGS. 5 to 12, use has been made of a temperature detecting element in which a temperature-voltage converting element such as a transistor, a diode and the like is composed of semiconductors having different conductivities. Use may also be made of an element composed of a conductor and a semiconductor joined thereto as the temperature-voltage converting element, such as for example, a Schottky diode.

Further embodiments of temperature detectors 6 will now be described.

Figure 13:
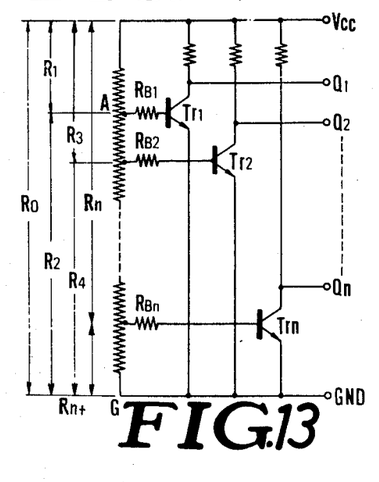
FIGS. 13 and 14 are circuit diagrams showing other embodiments of the temperature detector adapted for use in the electronic timepiece according to the invention.

In FIG. 13 there is shown a temperature detector comprising a plurality of transistors $Tr_1, Tr_2, ... Tr_n$. The bases of these transistors $Tr_1, Tr_2, ... Tr_n$ are slidably connected through resistors $R_{B1}, R_{B2}, ... R_{Bn}$ to various points of a voltage divider resistor network $R_0$.

The common voltage divider network $R_0$ is divided into sections $R_1$ and $R_2$ by the slidable contact of the base resistor $R_{B1}$ of transistor $Tr_1$ such that the base-emitter voltage $V_{BE}$ of the transistor $Tr_1$ is equal to the threshold value of the transistor $Tr_1$ at a given temperature.

The common voltage divider network $R_0$ is also divided into sections $R_3$ and $R_4$ by the slidable contact of the base resistor $R_{B2}$ of the transistor $Tr_2$ such that the base-emitter voltage $V_{BE}$ of the transistor $Tr_2$ is equal to the threshold value of the transistor $Tr_2$ at a different given temperature. Similarly, the common voltage divider network $R_0$ is divided into a section $R_n$ and a section $R_{n+1}$ by the slidable contact of the base resistor $R_{Bn}$ of the transistor $Tr_n$ such that the base-emitter voltage $V_{BE}$ of the transistor $Tr_n$ is equal to the threshold value of the transistor $Tr_n$ at another different given temperature. If the temperature is lower than the given temperatures for all of the transistors $Tr_1, Tr_2, ... TR_n$, all of these transistors assume an OFF condition and their collector potentials become 1.

If the temperature rises to the given temperature for the transistor $Tr_1$, the transistor $Tr_1$ only changes to an ON condition to make its collector potential 0.

In this case, all of the other transistors are OFF and their collector potentials are held at 1.

If the temperature rises higher and arrives at a given temperature defined for the transistor $Tr_2$, the transistor $Tr_2$ changes to an ON condition, rendering its collector potential 0. In this case, all of the other transistors except transistors $Tr_1$ and $Tr_2$ are in an OFF condition, and as a result, digital signals whose state is reversed from their respective initial conditions are delivered in succession.

If the transistor $Tr_1$ changes to an ON state, the resistor $R_2$ between the slidable contact A and the grounded terminal G is connected in parallel with the base resistor $R_{B1}$ of the transistor $Tr_1$. In order to make such parallel resistors substantially equal to the resistor $R_2$, the base resistor $R_{B1}$ is selected such that $R_{B1} >> R_2$. Then, the combined resistance of the parallel resistors is given by $$\frac{R_2 + R_{B1}}{R_2 + R_{B1}} = \frac{R_2}{R_2/R_{B1} + 1} = R_2$$

and hence become substantially equal to $R_2$.

The common voltage divider network $R_0$ may be composed of a plurality of fixed resistors $R_{21}, R_{22}, ... R_n$, and $R_{n+1}$ as shown in FIG. 14.

Figure 14:
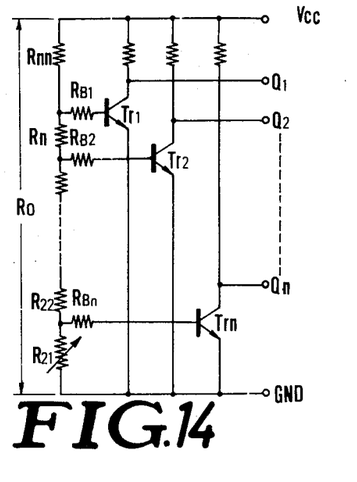

If the common base bias resistor $R_0$ shown in FIGS. 13 and 14 is of a fixed resistor, it is only possible to effect temperature compensation for a time reference signal generator having a given temperature-frequency characteristic. On the contrary, if at least a part of the common base bias resistor $R_0$ is made variable, it is possible to effect temperature compensation for a time reference signal generator having any desired temperature-frequency characteristics.

Figure 15:
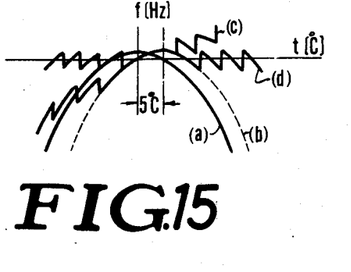
FIG. 15 graphically represents the temperature-frequency characteristics of the time reference signal generator.

That is, if respective individual resistance values of common voltage divider network $R_0$ are fixed, it is only possible to effect temperature compensation for a time reference signal generator having a temperature-frequency characteristic curve (a) shown by full line in FIG. 15. But, if this temperature detector is used to effect temperature compensation for a time reference signal generator having a temperature-frequency characteristic curve (b) whose zero temperature coefficient deviates from that of the temperature-frequency characteristic curve (a) by 5°C and shown by dash lines in FIG. 15, the temperature-frequency characteristic curve (b) is changed into a temperature-frequency characteristic curve (c), thereby rendering a highly precise temperature compensation impossible.

If at least a part of common resistor $R_0$, such as, for example, the resistor $R_{21}$ shown in FIG. 14 is made variable or replaced by another resistor, the temperature-frequency characteristic curve (c) can be corrected to a temperature-frequency characteristic curve (d) as shown in FIG. 15.

The electronic timepiece can be temperature compensated by means of a temperature compensating device comprising a temperature detector having a temperature sensitive element and a coded signal generator; the temperature detector may include only one temperature detecting element and deliver a digital signal whose state is reversed from an initial condition at a temperature higher than a plurality of respective temperatures.

Figure 16:
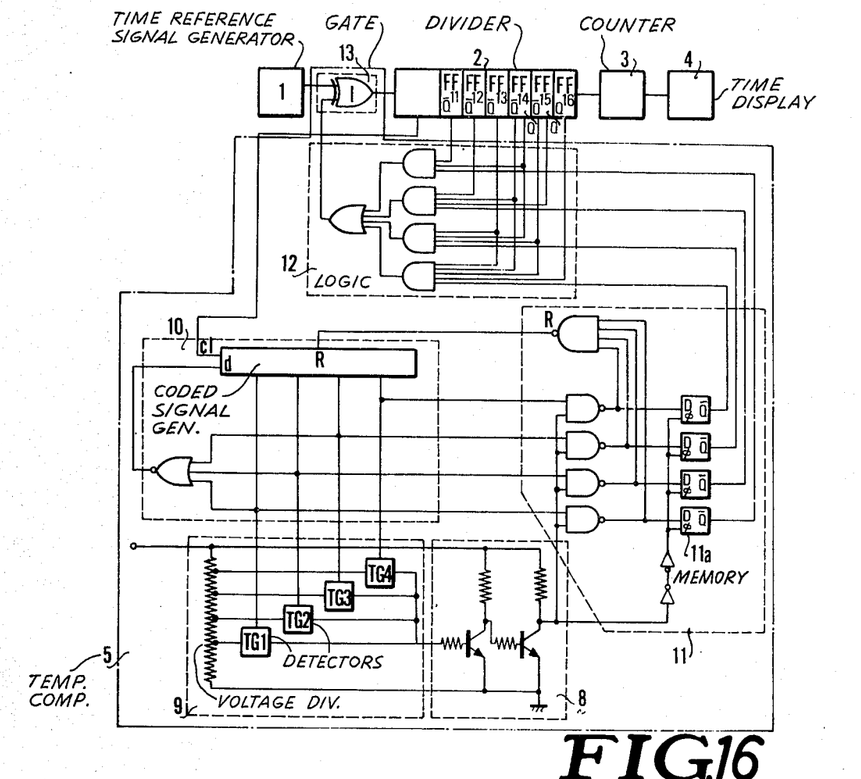
FIG. 16 is a circuit diagram showing in greater detail the embodiment of the electronic timepiece according to the invention shown in FIG. 4.

In FIG. 16 is shown in greater detail a circuit diagram of the temperature compensated electronic timepiece of FIG. 4.

In FIGS. 4 and 16 the same reference numerals are used to designate equivalent parts shown therein.

The temperature compensating device 5 shown in FIG. 16 comprises a temperature sensing device 8 including only one temperature detecting element, a voltage generator 9 for supplying a voltage for determining a detection temperature, a coded signal generator 10 including of a shift register for controlling the output voltage from the voltage generator 9, a temperature coded signal discriminator 11 for forming a temperature coded digital signal from the output signals of temperature sensing device 8, and of coded signal generator 10 and from memorizing of the temperature coded signal, a frequency control circuit 12 for forming narrow pulse signals from the output signals of the temperature coded signal discriminator 11 and the divider 2, and a frequency adder circuit 13 adding the output signal from the frequency control circuit 12 to the output signal from the time reference signal generator 1.

The operation of the temperature compensated electronic timepiece shown in FIG. 16 is as follows.

The coded signal generator 10 includes a shift register which delivers no data output from any of its output terminals when in an initial condition during which input clock pulses are absent. When input clock pulses are present, the data pulse outputs are shifted in succession in response to the number of the input clock pulses.

The data pule outputs thus shifted are delivered to the detection temperature determining voltage generator 9 so as to control electronic switches such as transmission gates $TG_1$, $TG_2$, $TG_3$, $TG_4$ and the like, and as a result, a voltage is delivered from the detection temperature determining voltage generator 9 to temperature sensing device 8.

At a given temperature i.e., if a voltage which is equal to a boundary voltage which reverses the initial condition of the temperature sensing device 8 is delivered from detection temperature determining voltage generator 9 to temperature sensing device 8, an output signal is delivered from the temperature sensing device 8 to temperature coded signal discriminator 11 which recognizes the output signal from each shift register stage of coded signal generator 10 as a temperature coded signal which is then memorized in a memory circuit 11a. Then, a reset signal is delivered from temperature coded signal discriminator 11 to the shift register to reset the latter, thereby returning coded signal generator 10 to its initial condition readying it for a next temperature detection.

The temperature coded signal memorized by the memory circuit 11a is retained therein until a next temperature coded signal arrives at the memory circuit. Then, the temperature coded signal is delivered to one terminal of one of the AND gates of frequency control circuit 12.

The other terminals of AND gates of thhe frequency control circuit 12 are supplied with outputs from divider 2. Narrows pulses deviating in phase from each other are delivered from the AND gates through an OR gate to one of the input terminals of an EXCLUSIVE-OR-gate 13, its other input terminal being connected to the output terminal of the time reference signal generator 1 thus, causing, frequency addition.

In general, the frequency-temperature characteristic curve of the time reference signal generator 1, that is, an oscillator circuit comprising an oscillator having an electro-mechanical converter such as, for example, a crystal oscillator and the like is graphically represented by a second degree or curve of third degree. Thus, if the frequency at a temperature range to be used is adjusted to a frequency lower than the ideal frequency which is a divided reference signal frequency having a minimum time period used in practice for counting, the output frequency of divider 2 becomes substantially equal to the ideal desired frequency and is delivered to time counter 3.

In the embodiment shown in FIG. 16, the temperature coded signal is repeatedly supplied to the AND gates of the frequency control circuit 12. Provision may be made for a timer to sample the temperature coded signal for the purpose of economizing the consumed power.

As above described, the electronic timepiece shown in FIG. 16 is constructed so that when any temperature change occurs the output frequency from the time reference signal generator 1 is varied, but the output frequency from the divider 2 is kept substantially at a frequency equal to that prior to occurrence of the temperature change.

Figure 17:
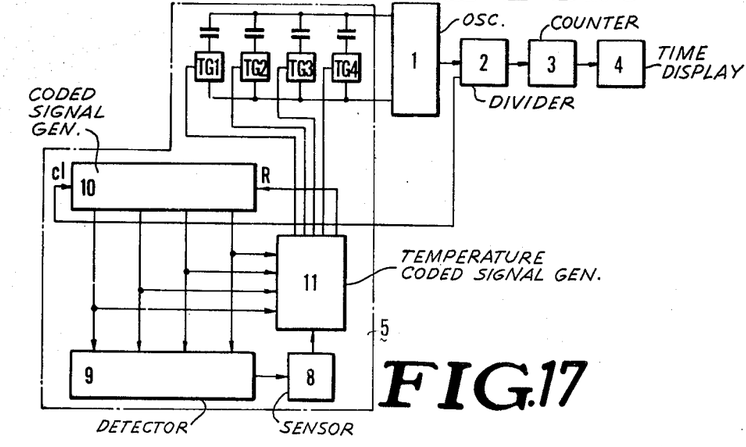
FIG. 17 is a partial circuit diagram showing in greater detail the embodiment of the electronic timepece of FIG. 3 according to the invention.

FIG. 17 shows in greater detail a block diagram of the temperature compensated electronic timepiece of FIG. 3 constructed so that when any temperature change occurs the output frequency from the time reference signal generator 1 is kept substantially at a frequency equal to that prior to the occurrence of the temperature change. In FIGS. 3 and 17 the same reference numerals are used to designate the same parts shown therein.

If input clock pules are supplied to a coded signal generator 10 composed of a counter circuit, two-valued logic digital signals are delivered from the output terminals of the counting states to a detection temperature determining voltage generator 9 composed of a D-A converter.

The D-A converter is comprised of a ladder shaped resistor circuit which can successively change the amount of voltage.

If the voltage supplied from the detection temperature determining voltage generator 9 to a temperature sensing device 8 at a given temperature coincides with the boundary voltage which deliveries a two valued logic digital signal whose state is reversed from the initial condition, the output from the temperature sensing device 8 is delivered to one of the input terminals of the gate circuit of a temperature coded signal discriminator 11. In addition, the outputs from the respective stages of the counter 10 are supplied to the other input terminals of the temperature coded signal discriminator 11, and as a result, the temperature coded signal corresponding to a given temperature is fed from the temperature coded signal discriminator 11 to a memory circuit provided therefore and memorized therein until a next temperature coded signal arrives at the memory circuit. This temperature coded signal serves as a control signal for changing the time-determining capacity element of the time reference signal generator 1 with the aid of electronic switches such as transmission gates $TG_1$, $TG_2$, $TG_3$, $TG_4$ and the like. Thus, the electronic timepiece shown in FIG. 17 is capablle of changing the time-determining capacitative element of the time reference signal generator 1 when subjected to any temperature change and hance the output therefrom, and of delivering a frequency which is substantially equal to the frequency generated by time reference signal generator 1 or if its temperature were to be held constant, which is then fed to time counter 3.

FIG. 11 shows a temperature detector 6 and a signal converter 7 for controlling a correction frequency amount in a temperature compensating device 5 wherein the output signal is the same temperature coded signal as that of a temperature coded signal discriminator 11 as the embodiments shown in FIGS. 16 and 17.

FIG. 3 shows an embodiment wherein the output signal from a time count signal forming mechanism 2 is used as the input signal of a timer circuit so that a temperature coded signal may be obtained in a sampling mode.

FIG. 4 shows the input signal at one terminal of frequency control circuit 12.

In a detecting temperature determining voltage generator 9, a voltage amount delivered to a temperature sensitive means 8 is changed by means of a digital-analog converter and its output is applied as one input terminal of a GATE circuit in the temperature coded signal discriminator 11 from the temperature sensitive device 8 at the voltage corresponding to the actual temperature. Further the outputs of respective stages of a coded signal generator 10 are applied as the other input terminal of the respective temperature coded signal discriminator 11. Therefore the basic difference of FIGS. 16 and 17 exists in the point that the formers device delivers in order the predetermined voltage amount by a switch and the latter device delivers it by a digital-analog converter.

As stated hereinafter, the electronic timepiece according to the invention has the advantage that it can be reliably temperature compensated, can operate in a stable state for a long time even when subjected to external temperature changes, and that almost all circuit elements of the temperature compensating device can be incorporated into an integrated circuit, thereby making it small in size.

What is claimed is:

1. An electronic timepiece comprising:
   an oscillator having an output frequency variable with temperature and forming a time reference signal generator for generating a time reference signal at the oscillation frequency;
   a time-count unit-signal former connected to said generator for dividing said time reference signal to form time-count unit-signal;
   a time counter for counting said time-count unit-signals to form a time-indicating signal;
   a display connected to said counter for providing a visual representation of time in response to said time-indicating signal;
   a temperature compensating device connected between the time reference signal generator and the time count unit-signal former for receiving a signal from the time count unit-signal former;
   the temperature compensating device having a temperature sensitive means, a voltage generator, a coded signal generator, a temperature coded signal discriminator, a frequency control circuit, and a frequency addition circuit;
   in the temperature sensitive means the emitter of a transistor is connected to one electrode of a constant voltage supply source and the collector is connected through a resistor to the other electrode of said constant voltage supply source and delivering a digital signal reversed from an initial state if the base-emitter voltage of the transistor becomes equal to the threshold value of the transistor at a given temperature when the change of a voltage-current characteristic is effected by the temperature change at the base-emitter junction;
   the voltage generator for supplying different voltages to the base-emitter of the temperature sensitive device by changing-over with an electronic switch such as a transmission one wherein a resistor is connected in series between one and the other electrodes of the said constant voltage supply source;
   the coded signal generator comprising a shift register receiving an input clock signal from the time-count unit-signal former, controlling the electronic switch of the voltage generator and delivering a signal as the standard of a temperature coded signal;
   the temperature coded signal discriminator discriminating the temperature coded signal from the output signal of the temperature sensitive means and that of the coded signal generator by an NAND gate and memorizing it until the next temperature coded signal;
   the frequency control circuit forming a thin pulse from the output of the temperature coded signal discriminator and that of the time-count unit-signal former; and
   the frequency addition circuit comprising an EXCLUSIVE-OR GATE circuit adding the output signal of the frequency control circuit to the time reference signal generator, whereby it compensates the change of the oscillating frequency in the time reference signal generator caused by the temperature change.

2. An electronic timepiece comprising:
   an oscillator having an output frequency variable with temperature and forming a time reference signal generator for generating a time reference signal at the oscillation frequency;
   a time-count unit-signal former connected to said generator for dividing said time reference signal to form time-count unit signals;
   a time counter for counting said time-count unit signals to form a time-indicating signal;
   a display connected to said counter for providing a visual representation of time in response to said time-indicating signal;
   a temperature compensating device connected between the time reference signal generator and the time count unit-signal former for receiving a signal from the time count unit-signal former;
   the temperature compensating device having a temperature detector, a frequency control circuit and a frequency addition circuit;
   the temperature detector comprising a circuit having a transistor used as a temperature detecting element, in which the output from a constant voltage supply source voltage-divided by a voltage division resistor is connected to the base of the transistor when the changes of voltage-current characteristics are caused by temperature changes at the junction of a base-emitter in the transistor, the emitter of the transistor is connected to one electrode of the constant voltage supply source, the collector of the transistor is connected through a resistor to the other electrode of the constant voltage supply source, and said voltage-division resistor being set by a control means such that the voltage between base-emitter of the transistor is equal to the threshold value at a higher temperature than a given temperature so that a digital signal reversed from an initial condition is delivered as a temperature signal from the collector of the transistor;

the frequency control circuit forming a thin pulse from the outputs of the temperature detector and those of the time-count unit-signal former; and further the frequency addition circuit comprising an EXCLUSIVE-OR-GATE for adding the outputs of the frequency control circuit and pulses from the time reference generator; whereby it compensates the oscillation frequency change of the time reference signal generator.

* * * * *